United States Patent [19]

Fliegel

[11] Patent Number: 5,028,895
[45] Date of Patent: Jul. 2, 1991

[54] NOTCH FILTER FOR REDUCING CLOCK SIGNAL FEEDTHROUGH EFFECTS IN AN ACOUSTIC CHARGE TRANSPORT DEVICE

[75] Inventor: Frederick M. Fliegel, Tempe, Ariz.

[73] Assignee: Motorola, Inc., Schaumburg, Ill.

[21] Appl. No.: 530,952

[22] Filed: May 29, 1990

[51] Int. Cl.$^5$ .............................................. H03H 7/01
[52] U.S. Cl. .................................... 333/176; 333/170; 333/171; 333/193
[58] Field of Search ............... 333/165, 170, 172, 175, 333/176, 174, 193, 194; 307/520; 377/57; 330/107, 109

[56] References Cited

U.S. PATENT DOCUMENTS

| | | | |
|---|---|---|---|
| 4,314,215 | 2/1982 | Tanji et al. | 333/193 |
| 4,577,168 | 3/1986 | Hartmann | 333/170 |
| 4,599,587 | 7/1986 | Hartmann et al. | 333/176 |
| 4,694,266 | 9/1987 | Wright | 333/176 X |

OTHER PUBLICATIONS

Plass, "Acoustic Surface Wave Band-Stop Filter for UHF Freq.", 1973 European Microwave Conf., vol. II, Belgium, Sep. 4-7, 1973.
Hartmann et al., "Saw Notch Filters", 1987 Ultrasonics Syposium, pp. 131-138.

*Primary Examiner*—Eugene R. LaRoche
*Assistant Examiner*—Seung Ham
*Attorney, Agent, or Firm*—Frank J. Bogacz

[57] ABSTRACT

A notch filter for reducing clock signal feedthrough effects in an acoustic charge transport (ACT) device. This notch filter is included on the same substrate as an ACT device. This notch filter may be employed to remove clock signals which have greater voltage than the data signals in an ACT device. This notch filter may be employed either at the input or the output of the ACT device. The notch filter includes a bridge connection of surface acoustic wave transducers and RC networks on opposite sides of the bridge configuration. Each side of the bridge is balanced so that at the notch filter frequency, the voltage output by each side of the bridge is one-half of the input voltage and in phase. These voltages produced by each half of the bridge are differenced and a zero output voltage is produced at approximately a notch or center frequency.

15 Claims, 3 Drawing Sheets

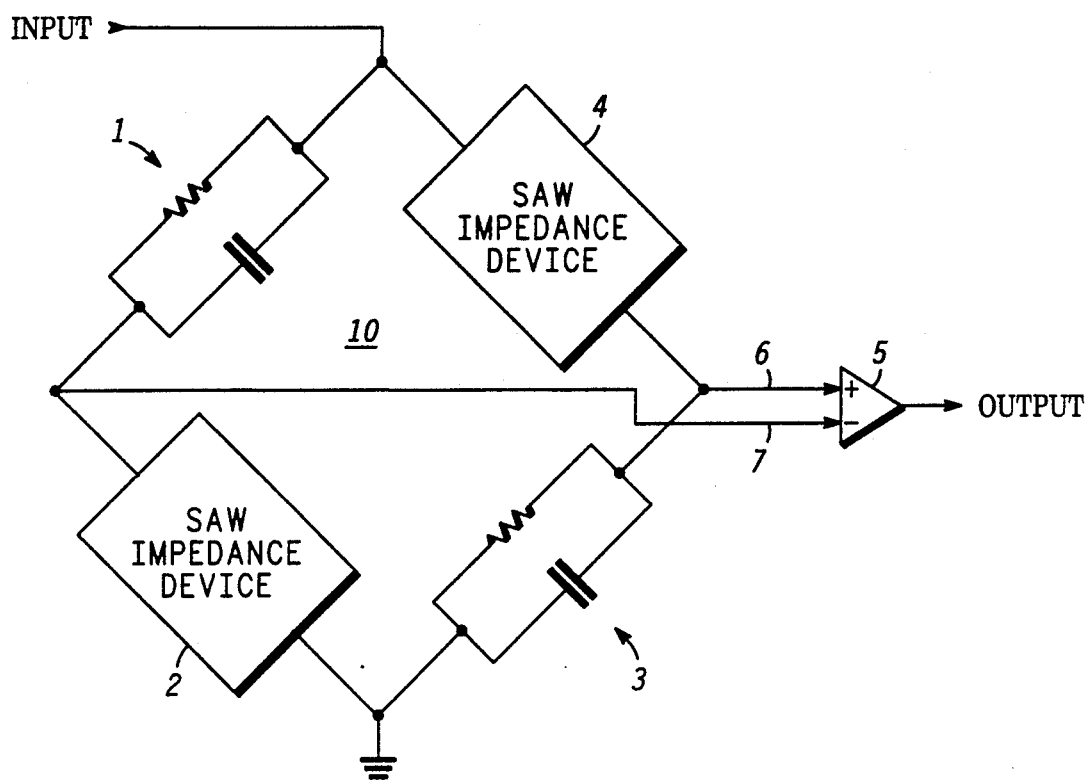
FIG. 1
FIG. 5
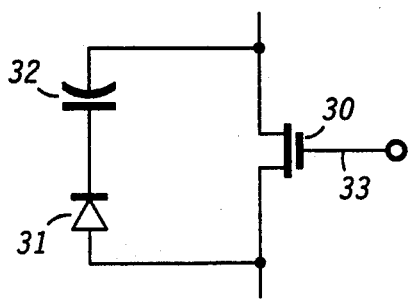

FIG. 2
FIG. 3
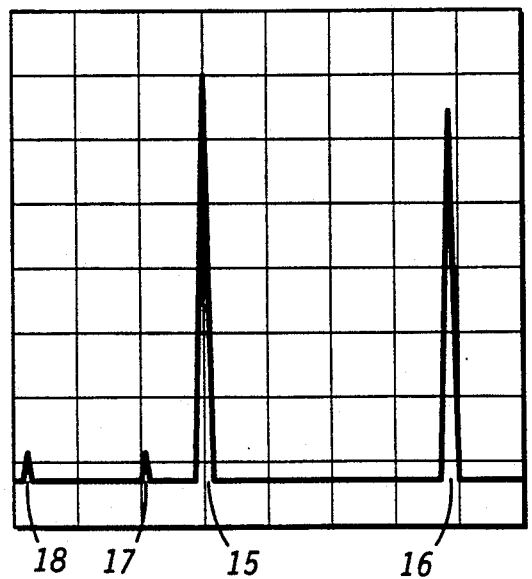

NOTCH FILTER FOR REDUCING CLOCK SIGNAL FEEDTHROUGH EFFECTS IN AN ACOUSTIC CHARGE TRANSPORT DEVICE

BACKGROUND OF THE INVENTION

The present invention pertains to acoustic charge transport (ACT) devices and more particularly to an arrangement for reducing the effects of the clock signal level present at the input and output of an ACT device.

In ACT devices, a clock signal is used as a carrier to transport charge packets representing data through the semiconductor medium. The clock signals are greater in voltage than that manifested by the change representing the data themselves and therefore have a great effect on the ability of interface circuitry to recognize the data and not react to clock signals. Therefore, it is important to provide a notch filter on the ACT substrate which can remove the unwanted clock signals before downstream processing, without sacrifice of the broad signal bandwidth.

Notch filters which perform this function are typically built utilizing inductors. One such arrangement is shown in U.S. Pat. No. 4,577,168, issued to Clinton S. Hartmann on Mar. 18, 1986, and entitled "Notch Filter." The use of inductors creates a problem in that inductors are large in size, must typically mounted off the substrate of the ACT device and introduce a phase shift to the signals. U.S. Pat. No. 4,599,587, issued on July 8, 1986 to C. Hartmann et al. and entitled "Impedance Element" pertains to unidirectional SAW transducers for use in notch filters.

If inductors are put on the substrate with the ACT device, such inductors exhibit a low Q. Therefore these low Q circuits are not as useful as ACT chips with inductors which are not implemented on the substrate. In addition, inductors which are off the substrate have a sizable weight by comparison to the ACT device. The size of such inductors is large. Furthermore, separate inductors increase the part count, cost of assembly, and overall cost of the circuitry.

Accordingly, it is an object of the present invention to provide a notch filter for reducing the clock signal feedthrough effects in acoustic charge transport devices without the use of inductors.

It is a further object of the present invention to implement the notch filter monolithically with the acoustic charge transport device.

SUMMARY OF THE INVENTION

In accomplishing the object of the present invention, a novel notch filter for reducing the clock signal feedthrough effects in ACT devices will be shown.

A notch filter reduces the clock signal feedthrough effects of an acoustic charge transport device. The notch filter and the acoustic charge transport device are co-located on the same substrate of semiconductor material.

The notch filter includes a bridge circuit which provides first and second output signals. These output signals are approximately equal in magnitude and phase. The bridge circuit is also adapted to receive an input signal which includes a clock signal and a relatively smaller in magnitude data signal. The bridge circuit provides the first and second output signals at the frequencies of the clock and data signals.

A combining arrangement is connected to the bridge circuit. The combining arrangement operates in response to the first and second signals to produce a zero voltage output at the clock signal frequency.

The above and other objects, features, and advantages of the present invention will be better understood from the following detailed description taken in conjunction with the accompanying drawings.

BRIEF DESCRIPTION OF THE DRAWING

FIG. 1 is a schematic diagram of an arrangement for reducing clock signal feedthrough effects in an ACT device.

FIG. 2 is a waveform diagram of the measured spectrum of an ACT device at the input port.

FIG. 3 is a waveform diagram of the measured spectrum of an ACT device at the output port.

FIG. 5 is a schematic diagram for a control network arrangement.

DESCRIPTION OF THE PREFERRED EMBODIMENT

Figure 4:
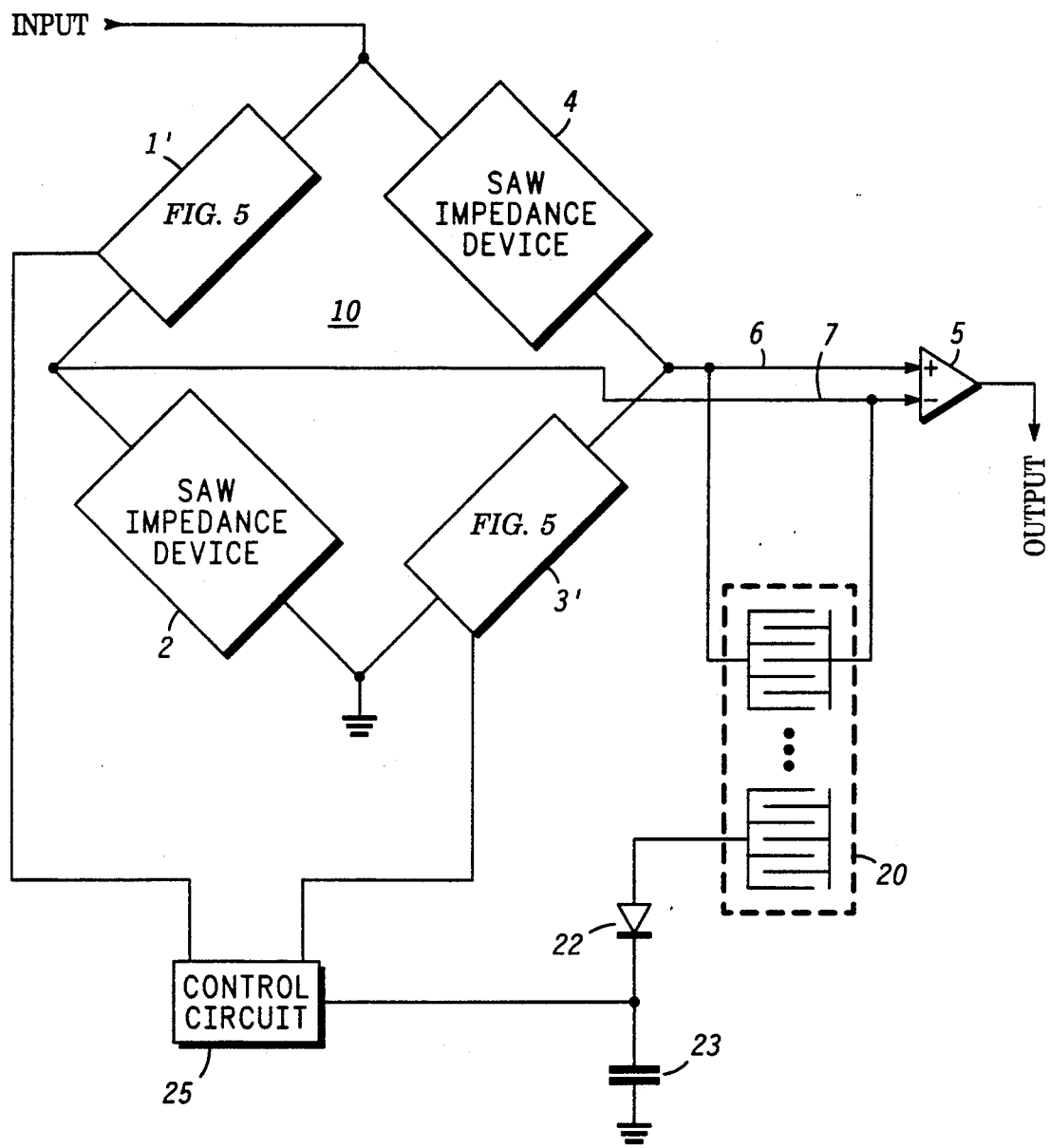
FIG. 4 is a schematic diagram for control arrangement for reducing clock signal effects in an ACT device.

Referring to FIG. 1, a notch filter for reducing clock signal feedthrough effects in acoustic charge transport (ACT) devices is shown. FIG. 1 depicts the addition to the ACT chip which is monolithically implemented on the ACT chip. The input and output of the ACT portion (not shown) of the chip may include the circuit of FIG. 1. The signal on the INPUT lead has both the data and the clock signals. Since the clock signal is used as a carrier, it is quite large in voltage and must be separated from the data before downstream processing occurs.

The INPUT lead is connected to the common connection of RC network 1 and unidirectional SAW impedance device 4. SAW impedance device 4 is a unidirectional SAW transducer device such as are commonly available in the commercial market. RC network 1 is serially connected to SAW impedance device 2. SAW impedance device 2 is also a commercially available unidirectional SAW transducer. SAW impedance device 2 is serially connected to RC network 3. The common connection of SAW impedance device 2 and RC network 3 is connected to electrical ground. RC network 3 is serially connected to SAW impedance device 4. RC networks 1 and 3 each include a resistor and a capacitor connected in parallel; these may, alternatively be series connected. The common connection of SAW impedance device 4 and RC network 3 is one of the outputs, which is connected to differential amplifier 5. The other input to differential amplifier 5 is from the common connection of RC network 1 and SAW impedance device 2 via lead 7. The signal on the OUTPUT lead will then contain just data, the clock signals having been removed.

The configuration of RC networks 1 and 3 with SAW impedance devices 2 and 4 is a bridge circuit configuration 10. In this bridge circuit configuration, opposite sides of the bridge are RC networks 1 and 3 while the other opposite sides of the bridge are SAW impedance devices 2 and 4.

When the signal of the ACT device is applied on the input lead, the SAW impedance devices 2 and 4 act as capacitors over the frequency range outside of their pass band. In this frequency range, the bridge is unbalanced and so acts as an all pass circuit delivering the signal on the INPUT lead through differential amplifier 5 to the OUTPUT lead.

At the center frequency of the SAW impedance devices 2 and 4, the impedance of the SAW impedance devices 2 and 4 is exactly the same as the impedance of the RC networks 1 and 3, respectively. That is, RC network 1 and SAW impedance device 2 have the same impedance while RC network 3 and SAW impedance device 4 have the same impedance. The impedance of RC networks 1 and 3 may be the same as the impedance of SAW impedance devices 2 and 4. Although the circuit of FIG. 1 will operate equally as well as long as RC network 1 and SAW impedance device 2 are the same impedance and RC network 3 and SAW impedance device 4 are the same impedance, not necessarily the same as RC network 1 and SAW impedance device 2.

At the center frequency or notch frequency of each SAW impedance device 2 or 4, the impedance of the SAW impedance device is exactly the same as the impedance of each RC network 1 or 3, respectively. The values of resistor and capacitor of each RC network 1 and 3 are selected so that their impedance is exactly the same as that of the SAW impedance device at the particular notch or center frequency. As a result, the voltages on leads 6 and 7 are exactly the same. When these voltages are applied to differential amplifier 5, the resultant signal on the output lead of the differential amplifier 5 is zero voltage. That is, at the frequency of the clock signal of the ACT device, this circuit outputs a zero voltage thereby eliminating the clock signal from downstream processing. This occurs only at the very narrow frequency range of approximately the ACT device clock frequency. All other frequencies are substantially passed through differential amplifier 5 to the output lead.

The voltages at the output of the bridge circuit configuration 10 on leads 6 and 7 are each one-half of the voltage magnitude of the signal on the INPUT lead. In addition, the signals on the INPUT and OUTPUT and leads 6 and 7 are in phase.

The circuit of FIG. 1 may be employed at the input to the ACT device to eliminate clock feedback through the input port of an ACT device. Further, as previously indicated, the circuit of FIG. 1 may be employed at the output of the ACT device or at the NDS (non-destructive sensing) tapping structure of the ACT device.

This circuit may be implement on the same substrate along with the ACT device. Thereby fewer interconnections and parts and assembly are required. In addition, the size of the entire circuit is the size basically of the ACT chip. The added weight and size of inductors has therefore been eliminated.

Also, the use of inductors introduces phase differences to the signals for which compensations with additional circuitry must be made. In the Applicant's arrangement, no phasing differences have been introduced and, therefore, the filtering is much more effective.

Another advantage of the circuit of FIG. 1 is that when it is employed at the NDS port of an ACT device, a lower power amplifier may be used in the NDS (non-destructive sensing) post-processing circuitry. The advantage of being able to use lower power amplifiers in the post-processing circuitry obtains from the fact that the clock signal which is the largest signal in the ACT device, has been eliminated. The circuit of FIG. 1 reduces the maximum signal level to the amplifier circuitry by eliminating the relatively large in magnitude clock signal. Without the use of the circuit of FIG. 1, a larger dynamic range amplifier would be required in order to avoid saturation and intermodulation effects in the amplifier. By reducing the power handling requirements of the amplifiers, the DC power requirements of the overall ACT module are reduced as well.

It is to be noted that the SAW impedance devices or SAW transducers of the present invention are unidirectional transducers. This is necessary in order to maintain the required amplitude and phase over the required bandwidth.

Referring to FIG. 2, a waveform diagram of the spectrum of the ACT input port is shown. The top of the scale corresponds to 0 dBm. The vertical scale is 10 dB per division The horizontal scale is approximately 100 MHz per division. Waveform 12 is the signal trace of the clock signal at 360 MHz. Waveform 13 is the clock signal at 720 MHz which is the first harmonic of waveform 12.

FIG. 3 represents the clock signal of the ACT device at the output port. The horizontal and vertical scales are the same as mentioned above for FIG. 2. Waveform 15 is the clock signal at 360 MHz while waveform 16 is the first harmonic of the clock signal at 720 MHz. Waveforms 17 and 18 are small spurious signals.

FIG. 4 depicts the bridge circuit 10 amplifier 5 configuration shown in FIG. 1 with the addition of a controlling network. SAW filter 20 is connected between the outputs 6 and 7 of bridge circuit 10. SAW filter 20 is tuned to the clock frequency of the ACT device. The output of SAW filter 20 is connected to diode 22. The output of diode 22 is connected to the common connection of capacitor 23 and control circuit 25. Capacitor 23 is connected between the common connection of diode 22 and control circuit 25 and electrical ground.

Devices 2 and 4 of bridge circuit 10 are SAW impedance devices as shown in FIG. 1. Items 1 and 3 were shown as RC networks in FIG. 1. Items 1 and 3 of FIG. 4 have now been replaced by the circuitry shown in FIG. 5. Each item 1' and 3' as shown in FIG. 4 includes a field effect transistor (FET) 30 connected in parallel with the series connection of diode 31 and capacitor 32. The arrangement shown in FIG. 5 replaces the RC networks 1 and 3 as shown in FIG. 1. The field effect transistor 30 has a gate input 33 which operates to control the field effect transistor 30. The gate input of FET 30 for each network 1' and 3' is connected to control circuit 25 as shown in FIG. 4.

Typically at the notch frequency or frequency of the clock signal, the voltages on leads 6 and 7 are equal. However, due to component tolerances, for example, the resistors and capacitors of RC networks 1 and 3 of FIG. 1, the voltages of leads 6 and 7 may not always be precisely equal. Therefore, the output lead may produce a slight voltage at the notch frequency.

In order to alleviate this problem, the control arrangement shown in FIG. 4 is added to the basic circuit arrangement as shown in FIG. 1. SAW filter 20, at the notch or center frequency, produces a voltage proportional to the larger of the two signals on leads 6 and 7. This signal is input from SAW filter 20 through diode 22, to control unit 25. Control unit 25 then transmits signals to the gate of FET 30 of item 1' or 3' to adjust the voltage applied to the gate input 33 of FET 30 therey altering the effective resistance of the FET. A similar control signal is applied to varactor diode 31, to adjust the voltage variable capacitor value to achieve the same impedance overall for the elements 1' and 3' as are obtained for the elements 2 and 4. As a result, the signals on leads 6 and 7 will be adjusted at the notch frequency so that these signals are equal. This will account for differences in the tolerance of individual components used in bridge circuit 10. As a result, the signals on leads 6 and 7 will be approximately at the notch frequency. When applied to differential amplifier 5, the signals will be equal and opposite and the combination will result in a zero voltage output on the output lead.

Although the preferred embodiment of the invention has been illustrated, and that form described in detail, it will be readily apparent to those skilled in the art that various modifications may be made therein without departing from the spirit of the invention or from the scope of the appended claims.

What is claimed is:

1. A notch filter for reducing clock signal feedthrough effects in an acoustic charge transport (ACT) device, said notch filter and said acoustic charge transport device being located on a substrate of semiconductor material, said notch filter comprising:

bridge circuit means for providing first and second output signals which are approximately equal in magnitude and in phase, said bridge circuit means adapted to receive an input signal including a clock signal and data signal, said bridge circuit provide said first and second output signals of a first value at a predetermined frequency of said clock signal; and said bridge circuit means including:
first impedance means connected to a source of said input signal and connected to a source of electrical ground, said first impedance means operating to provide said first output signal; and
second impedance means connected to said source of said input signal and connected to said source of electrical ground, said second impedance means operating to provide said second output signal;
said first impedance means includes first network impedance means connected to said source of said input signal; and
said first impedance means further includes first Surface Acoustic Wave (SAW) impedance means serially connected between said first network impedance means and said source of said electrical ground, said connection of said first network impedance means and said first SAW impedance means providing said first output signal;

said notch filter further comprising:
combining means connected to said bridge circuit means said combining means operating in response to said first and second signals to produce a third output signal of a zero value at said predetermined frequency.

2. A notch filter for reducing clock signal feedthrough effects in an ACT device as claimed in claim 1, wherein said first network impedance means includes:
resistance means; and
capacitance means connected in parallel with said resistance means.

3. A notch filter for reducing clock signal feedthrough effects in an ACT device as claimed in claim 1, wherein said first SAW impedance means includes a SAW transducer.

4. A notch filter for reducing clock signal feedthrough effects in an ACT device as claimed in claim 3, wherein said second impedance means includes second network impedance means connected to said source of electrical ground.

5. A notch filter for reducing clock signal feedthrough effects in an ACT device as claimed in claim 4, wherein said second network impedance means includes:
resistance means; and
capacitance means connected in parallel with said resistance means.

6. A notch filter for reducing clock signal feedthrough effects in an ACT device as claimed in claim 4, wherein said second impedance means further includes second SAW impedance means serially connected between said source of said input and said second network impedance means, said connection of said second network impedance means and said second SAW impedance means providing said second output signal.

7. A notch filter for reducing clock signal feedthrough effects in an ACT device as claimed in claim 5, wherein said second SAW impedance means includes a SAW transducer.

8. A notch filter for reducing clock signal feedthrough effects in an ACT device as claimed in claim 6, wherein said combining means includes means for determining a difference between said first values of said first and second output signals, said means for determining being connected to said connection of said first network impedance means and said first SAW impedance means and connected to said connection of said second network impedance means and said second SAW impedance means, said means for determining transmitting said data signal in unaltered form as said third output signal.

9. A notch filter for reducing clock signal feedthrough effects in an ACT device as claimed in claim 8, wherein said means for determining includes differential amplifier means.

10. A method for reducing the clock signal feedthrough effects of an acoustic charge transport (ACT) device comprising the steps of:
dividing an input signal, including a clock signal of a particular frequency and a data signal, into first and second signals;
first balancing said first signal between a first resistor/capacitor network and a first SAW transducer to provide a first output signal;
second balancing said second signal between a second resistor/capacitor network and a second SAW transducer to provide a second output signal; and
differencing said first and second output signals via a differential amplifier to produce a third output signal being a zero voltage level at said particular frequency of said clock signal and a value corresponding to said input signal at frequencies other than said particular frequency.

11. A notch filter for reducing clock signal feedthrough effects in an acoustic charge transport (ACT) device, said notch filter and said acoustic charge transport device being located on a substrate of semiconductor material, said notch filter comprising:
bridge circuit means for providing first and second output signals which are approximately equal in magnitude and in phase, said bridge circuit means adapted to receive an input signal including a clock signal and data signal, said bridge circuit providing said first and second output signals of a first value at a predetermined frequency of said clock signal;

said bridge circuit means including;
  first adjustable impedance means connected to a source of said input signal and connected to a source of electrical ground, said first adjustable impedance means operating to provide said first output signal; and
  second impedance means connected to said source of said input signal and connected to said source of electrical ground, said second impedance means operating to provide said second output signal;
said notch filter means further comprising:
control circuit means connected to said bridge circuit means, said control circuit means operating in response to said first and second output signals being non-equal to adjust said bridge circuit means to produce equal first and second output signals; and
combining means connected to said bridge circuit means, said combining means operating in response to said first and second signals to produce a third output signal of a zero value at said predetermined frequency.

12. A notch filter for reducing clock signal feedthrough effects in an ACT device as claimed in claim 11, said first adjustable impedance means including:
diode means;
capacitor means connected in series with said diode means; and
field effect transistor means having source and gate inputs and a drain output, said series connection of said diode means and said capacitor means connected in parallel with said source input and drain output of said field effect transistor means.

13. A notch filter for reducing clock signal feedthrough effects in an ACT device as claimed in claim 12, said control circuit means including:
SAW filter means connected to said first adjustable impedance means and to said second impedance means, said SAW filter means operating in response to said first and second output signals to produce a control signal;
second diode means connected to said SAW filter means; and
second capacitor means connected between said second diode means and a source of electrical ground.

14. A notch filter for reducing clock signal feedthrough effects in an ACT device as claimed in claim 13, wherein said control circuit means includes a control circuit connected to said second diode means and said second capacitor means and to said gate input of said field effect transistor means, said control circuit operating in response to said control signal to provide an adjusting signal for adjusting a voltage applied to said gate input of said field effect transistor means.

15. A notch filter for reducing clock signal feedthrough effects in an ACT device as claimed in claim 14, wherein said second impedance means includes Surface Acoustic Wave (SAW) impedance means.

* * * * *

UNITED STATES PATENT AND TRADEMARK OFFICE
CERTIFICATE OF CORRECTION

PATENT NO. : 5,028,895

DATED : July 2, 1991

INVENTOR(S) : Frederick M. Fliegel

It is certified that error appears in the above-identified patent and that said Letters Patent is hereby corrected as shown below:

In column 5, claim 1, line 26, replace "provide" with --providing--.

Signed and Sealed this

Eighth Day of June, 1993

Attest:

MICHAEL K. KIRK

Attesting Officer

Acting Commissioner of Patents and Trademarks